United States Patent [19]
Sobelman

[11] Patent Number: 6,043,674
[45] Date of Patent: Mar. 28, 2000

[54] NULL CONVENTION LOGIC GATES WITH FLASH, SET AND RESET CAPABILITY

[75] Inventor: Gerald Edward Sobelman, Minnetonka, Minn.

[73] Assignee: Theseus Logic, Inc., Orlando, Fla.

[21] Appl. No.: 09/004,336

[22] Filed: Jan. 8, 1998

[51] Int. Cl.[7] ........................ H03K 19/23; H03K 19/096; H03K 19/01

[52] U.S. Cl. ............................... 326/35; 326/35; 326/98; 326/17

[58] Field of Search ................................... 326/35, 36, 17, 326/93, 95, 98; 327/205, 206

[56] References Cited

U.S. PATENT DOCUMENTS

| | | | |
|---|---|---|---|
| 4,700,086 | 10/1987 | Ling et al. | 326/98 |
| 5,258,666 | 11/1993 | Furuki | 326/95 |
| 5,440,243 | 8/1995 | Lyon | 326/98 |
| 5,612,638 | 3/1997 | Lev | 326/98 |
| 5,828,234 | 10/1998 | Sprague | 326/98 |
| 5,841,300 | 11/1998 | Murabayashi et al. | 326/98 |

*Primary Examiner*—Michael Tokar
*Assistant Examiner*—James A. Cho
*Attorney, Agent, or Firm*—Steptoe & Johnson LLP

[57] ABSTRACT

Threshold logic gates are disclosed that respond to signals that may assume at least a first state having an arithmetic or logic meaning, and a second NULL state that has no arithmetic or logic meaning. Threshold values may be equal to or less than the number of input signal lines. Threshold gates switch their outputs from NULL to a meaningful state when the threshold number of inputs assume meaningful states. Gates will hold outputs in a meaningful (or non-null) state when the number of asserted inputs remains positive, even if the number is less than the threshold. In one embodiment, threshold gates include a "FLASH" input that forces the gate to NULL. In another embodiment, threshold gates include one or more "SET" inputs that drive the gate output to NULL or to a meaningfull state.

42 Claims, 10 Drawing Sheets

NULL CONVENTION LOGIC GATES WITH FLASH, SET AND RESET CAPABILITY

FIELD OF THE INVENTION

The invention relates to the field of electronic circuits, and more particularly to threshold logic circuits for arithmetic and signal processing.

BACKGROUND

Previous logic systems, such as Boolean logic systems, have employed clocking signals to regulate the sequential processing of binary logic signals. Typically, a sequential logic circuit will respond to multiple inputs to generate an output. As input logic signals propagate through the sequential circuit, the sequential circuit output is unreliable for a period of time corresponding to worst case propagation delays through the individual logic gates. Typically, the output signal is sampled at a time when the output is stable, often by latching the output into a register. The sampling time is determined by an independent clock signal, i.e., one that is not derived from the states of the logic gates themselves.

While these traditional synchronous circuits have become the dominant class of logic, a substantial amount of design analysis is necessary to avoid a variety of timing-related problems, such as worst-case propagation delay and race conditions. In addition, the proportion of power and microcircuit circuit area ("real estate") that must be devoted to clocking has become substantial, and in certain instances has become a limiting factor to the total amount of circuitry that can be integrated onto a single chip.

SUMMARY

The present invention provides logic circuits for use without independent clocks. The circuits implement a non-Boolean algebra using signals having a state which, by convention, has no logic meaning. Circuits may include a "flash-type" NULL convention threshold gate for use in larger NULL convention circuits. Multiple threshold gates in the circuit can simultaneously be switched to NULL in parallel using a common FLASH signal. In an alternate embodiment, the invention may include threshold gates that can be initialized to one of a number of states which might, or might not, have logic meaning.

A first preferred embodiment comprises a m-of-n flash-type NULL convention threshold gate including a plurality of n input signal lines, each having an asserted state and a NULL state; a FLASH input signal line having a high state and a low state; an output signal line having an asserted state and a NULL state; a hysteresis circuit switching the output signal line from the NULL state to the asserted state when a number m of input signal lines change from the NULL state to the asserted state, m being less than or equal to n, and holding the output signal line in an asserted state until all input signal lines return to NULL; and means for switching the output signal line from the asserted state to the NULL state when the FLASH input line changes from the low state to the high state.

An alternate preferred embodiment comprises a NULL convention threshold gate for use in asynchronous circuits that can be independently set to either a NULL or Asserted state via a separate SET signal coupled to the threshold gate.

BRIEF DESCRIPTION OF THE DRAWING FIGURES

The present invention will be described below with reference to attached drawings in which.

DETAILED DESCRIPTION OF THE PREFERRED EMBODIMENTS

Asynchronous circuits have been proposed that are intended to operate without an independent clock. One asynchronous logic paradigm is disclosed in U.S. Pat. No. 5,305,463 ("NULL Convention Logic"), which is incorporated herein by reference in its entirety. This paradigm uses logic gates referred to as threshold gates. Within this class, circuits are made with gates having varying numbers of inputs and threshold values. Further information about transistor level implementations of such circuits can be found in U.S. Pat. No. 5,656,948, which is incorporated herein by reference in its entirety.

Circuits described in U.S. Pat. Nos. 5,305,463 and 5,656,948 generate a result value set in response to an input value set. An important aspect of those circuits is that any particular input signal may have a meaningful value or a NULL value which has no meaning. The very presence of a non-NULL or meaningful value indicates that the value has meaning, and no external clock is required to indicate that a non-NULL value is meaningful.

Such NULL convention signals differ from traditional binary logic signals, where each signal line may have one of two meaningful states. In traditional Boolean logic that uses a CMOS or TTL implementation, a low voltage level on a signal line means "logic false" or the number "zero." A high voltage level on the same line means "logic true" or the number "one." Thus a signal line may assume one of two values, either of which ostensibly has meaning.

In traditional clocked Boolean logic circuits, however, a binary signal might— or might not—be valid at any given moment. Outputs of combinational circuits have a period of instability while input signals propogate through gates. Designers accommodate such periods of instability by analyzing the worst case propagation delays through such circuits and sample the signal only at predetermined times. Sampling times are usually determined by an external clock which triggers the storage of signals into a latch.

NULL convention logic signals have multiple implementations which include a NULL state which has no meaning. In one implementation, two physical signal lines would be used to convey two meaningful values. For example, logic "false" would be conveyed by asserting a low voltage on the first physical line and a high voltage on the second physical line. Logic "true" would be conveyed by asserting a low voltage on the first physical signal line and a high voltage on the second physical signal line. NULL would be conveyed by low voltage levels on both physical signal lines. (High voltage levels on both physical signal lines is unused.) In this example, meaning is expressed according to the physical signal line being asserted, not by the choice of voltage level. A high voltage level "asserts" the meaning of the line. A low voltage level is not a logic value. Alternatively, asserted meaning can be assigned to the ground voltage state, while a high voltage state has no logic meaning.

In another implementation, multiple voltages can be used on a single line to convey multiple meanings and NULL. For example, each signal line may be allowed to assume three voltage levels. A positive voltage level asserts the meaning "true", a negative voltage level asserts the meaning "false", and the zero is NULL (meaningless). In other implementations, parameters other than voltage may be used as long as the requisite number of states can be differentiated. Discussions here will assume an implementation in which each signal line may assume two voltage levels, with a high level asserting meaning and the ground voltage level being NULL. This provides voltage levels as concrete examples to aid in explanation, but the invention is not limited to these voltage-level examples.

Figure 1:
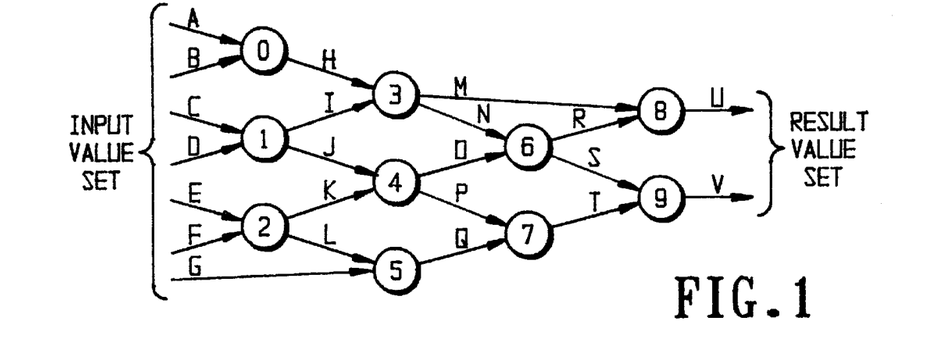
FIG. 1 illustrates a NULL convention combinational circuit.

Another important aspect of NULL convention circuits is the way that meaningful and NULL signals propagate through a combinational circuit. All inputs to a NULL convention logic element must be meaningful before the element asserts a meaningful output. FIG. 1 illustrates a NULL convention combinational circuit. In FIG. 1, logic gates are shown as circles and labeled with numerals 0–9. Input lines are labeled with letters A–G, output lines are labeled with letters U,V, and internal connection lines are labeled with letters H–T. Signal lines are schematic, and may be individual conductors, multiple conductors or another NULL convention signal format.

In a NULL convention circuit, a logic gate transitions from a NULL to a meaningful output value after all inputs have assumed meaningful values. For example, as illustrated in FIG. 1, assume that input lines A and B initially have NULL values, and logic gate zero (0) initially has a NULL output. In the case that only input line A transitions to a meaningful value (while input line B remains at NULL), logic gate zero (0) will maintain a NULL output value. In the case that only input line B transitions to a meaningful value (while input line A remains at NULL), logic gate zero (0) still will maintain a NULL output. When both input lines A and B transition to meaningful values, then logic gate zero (0) will change its output to a meaningful value.

The characteristic described above applies to all logic gates in the sequential circuit. Logic gates zero (0) through two (2), which are directly connected to input lines, will provide meaningful values to the next level of gates (three through five) only when the respective inputs have completely assumed meaningful values. This produces a general result that can be visualized as a wavefront of meaningful values propagating through the network. At the network output, logic gates eight and nine will change their individual outputs from NULL to meaningful values only when all upstream gates have propagated meaningful values.

Two important characteristics should now be apparent. First, the network outputs transition from NULL to meaningful values cleanly. That is, the outputs do not switch back and forth while partial results have propagated through the intermediate gates. Second, the very presence of a meaningful value at the network output is sufficient to indicate that the network has conclusively resolved all intermediate logic operations. The very presence of a meaningful value is sufficient to indicate that the value is steady, complete, and may be used by downstream circuitry. Thus, no external clock is required to indicate that the network has completed its operations.

In one implementation, the NULL convention logic gates discussed here also exhibit a second characteristic: their outputs transition from a meaningful value to NULL only when all inputs have switched to NULL. In this way, NULL values propagate through the network cleanly, and the very presence of NULL values at the output is sufficient to indicate that all gates in the network have returned to NULL output states. As will be discussed more fully below, deviation from this general rule may be permitted.

Figure 2A:
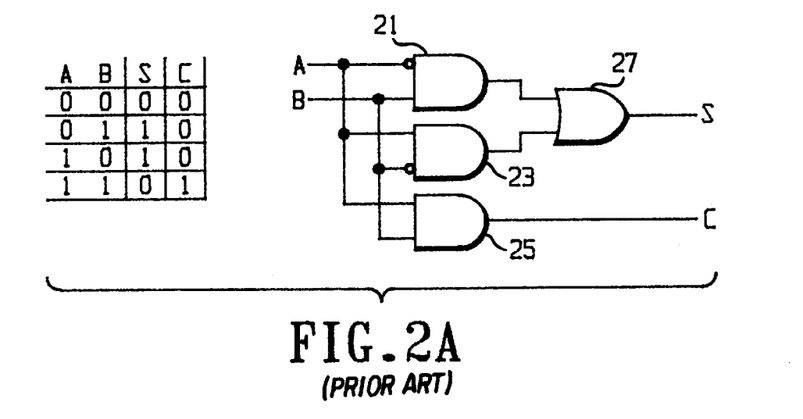
FIG. 2a illustrates a Boolean half-adder.

FIG. 2a illustrates a Boolean half-adder constructed of three AND gates 21, 23, 25 and an OR gate 27. The half adder has two input signal lines A and B, and two output lines S (sum) and C (carry). Each input line may assume one of two meaningful values: "zero" and "one." Each output line may assume one of two meaningful values: "zero" and "one." The half adder implements a transfer function such that:

i) when both inputs are zero, sum (S) and carry (C) outputs are "zero;"

ii) when a single input is "one" (and the other is "zero"), sum is "one" and carry is "zero;" and iii) when both inputs are "one," sum is "zero" and carry is "one."

Figure 2B:
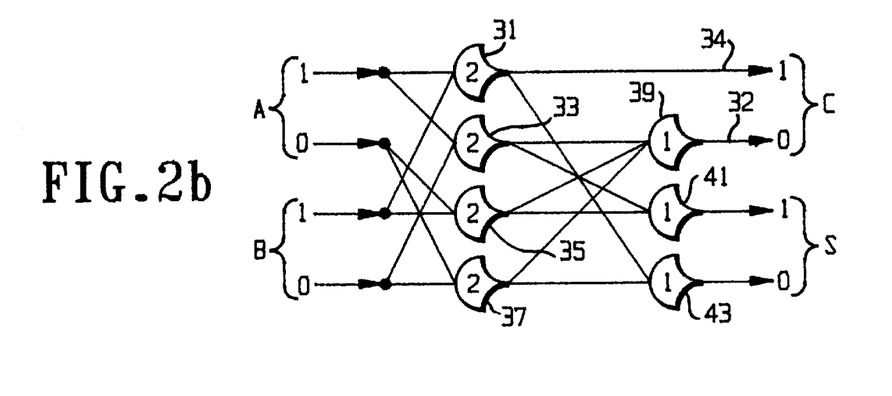
FIG. 2b illustrates a "two-wire" NULL convention half-adder.

For illustration and comparison, FIG. 2b illustrates a "two-wire" NULL convention half adder. It is similar to the boolean half-adder of FIG. 2a in that there are two inputs A and B and two outputs S and C, and it implements the same transfer function. Unlike the Boolean circuit, the NULL convention half-adder has a separate physical signal line for each arithmetic meaning. The carry output, for example, has two separate physical signal lines, each of which may assume one of two voltage levels. A first voltage level is meaningful and the other voltage level is NULL. In order to assert a meaning of "carry equals zero," the first signal line 32 (designated as having a meaning "zero" when asserted) is driven to its meaningful voltage level, while the second signal line is held at the NULL voltage level. In order to assert a value "carry equals one," the first signal line is held at the NULL voltage level, while the second signal line 34 (designated by design as having a meaning "one") is driven to the meaningful voltage level. The half-adder can also assert "carry has no meaning" by holding both carry signal lines at the NULL voltage. It is not permitted to have both carry lines at the meaningful voltage level simultaneously. Similarly, the remaining input and output signals (A, B, S) each have a pair of physical signal lines.

Hereafter, when a NULL convention circuit switches a signal to a meaningful logic or arithmetic value, it will be said that the circuit "asserts" the signal, or that the signal is "asserted." When a NULL convention circuit switches a signal to a NULL value, the signal will be said to be NULL. Similarly, a physical signal lines will be said to be "asserted" or "NULL" depending on its state.

The two carry lines form a group in which at most one line may be asserted (i.e., assume a meaningful value). Such a group is referred to has a "mutually exclusive assertion group." In other design situations, mutually exclusive assertion groups may have more than two lines. A single signal line, by itself, can be considered a mutually exclusive assertion group if its associated signal has only one meaningful state.

Internally, the NULL convention half adder is made of seven threshold gates 31, 33, 35, 37, 39, 41, 43. Each threshold gate has a single signal line output which may be asserted (assume a meaningful voltage level) or NULL (assume a NULL voltage level). The signal line may fan out to several destinations. Four of the gates 31, 33, 35, 37 have two input signal lines and a threshold of two ("threshold-two gate"). The output of a threshold-two gate is asserted when two (both) of the input lines are asserted. One of the gates 39 has three input signal lines and threshold of one ("threshold-one gate"). The output of the threshold-one gate is asserted when any one of the three inputs is asserted. Two of the gates 41, 43 have two inputs and a threshold of one. As a drawing convention, a numeral inside a threshold gate symbol indicates the number of asserted input lines needed to cause the gate to assert its output.

Each of the NULL convention gates of the half adder exhibits the characteristic that it switches to a meaningful value only when the requisite number of inputs becomes meaningful. In one NULL convention implementation, each threshold gate holds a meaningful output value until all of the inputs become NULL. Thus, threshold gates exhibit a hysteresis: as the number of inputs drops below the threshold, the output remains meaningful. For example, the threshold-two gates 31, 33, 35, 37 will maintain meaningful output levels when the number of meaningful inputs drops from two to one. The threshold-two gates will switch to NULL when all inputs become NULL. As discussed further below, deviation from this general rule may be permitted.

It should be appreciated that a threshold gate forms a central building block of NULL convention logic circuits. The NULL convention threshold gates may be characterized by the number of inputs and the threshold value. NULL convention threshold gates have the unique operational requirement that some or all inputs will form mutually exclusive assertion groups. They further ensure completeness of the input set, in that they switch to a meaningful output value only when all input signals are meaningful.

Figure 3A:
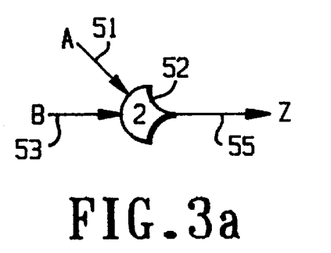
FIG. 3a illustrates a two-input, threshold-two gate.

FIG. 3a illustrates a symbol 52 for a two-input, threshold-two (two-of-two) NULL convention logic gate having inputs A and B and output Z. Here, each input line 51, 53 and the output line 55 each represent one physical signal line which is capable of assuming a meaningful value or NULL. When both input signals A,B are asserted, the output Z is asserted. After the output has been asserted, the output returns to NULL when both inputs A,B return to NULL.

Figure 3B:
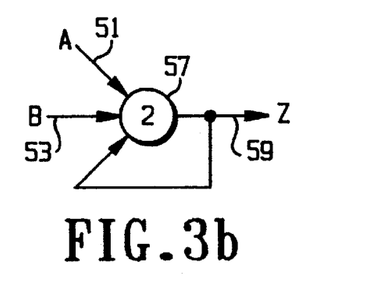
FIG. 3b illustrates a three-input majority-function gate with feedback.

FIG. 3b illustrates a symbol 57 for a three-input majority-function gate having two inputs A and B and an output Z as in FIG. 3a. The output line 59 is fed back as an input, which conceptually provides the functionality of the two-of-two NULL convention threshold gate of FIG. 3a. In isolation (i.e., without the feedback signal), the majority-function gate operates without hysteresis. When the number of asserted inputs is greater than two, the majority function gate output is asserted. When the number of asserted inputs is less than two, the majority function gate output goes NULL.

With feedback, the majority-function gate has hysteresis. When the output Z is asserted, the feedback line provides one asserted input. If the number of asserted inputs drops to one, then the feedback line provides a second asserted input to hold the majority function gate to an asserted output. The output Z will switch to NULL only when both independent inputs A and B become null. Conversely, when the output Z is NULL, the feedback line provides one NULL input. The output Z will be asserted only when both independent inputs A and B are asserted.

Figure 3C:
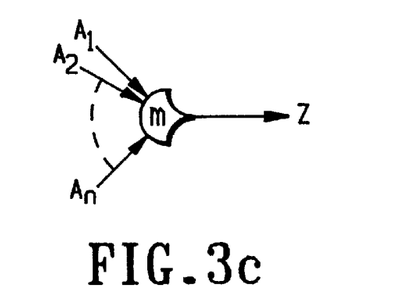
FIG. 3c illustrates a symbol for an n-input, threshold-m gate.

Although FIG. 3a specifically illustrates a two-of-two logic gate, it should be understood that similar gates can be configured having any number of desired input lines and threshold values. FIG. 3c depicts the symbol for an n-input, threshold-m (m of n) NULL convention logic gate, having inputs A1 through An and output Z, where m and n are integers, and m is less than or equal to n. In this case, output Z is asserted when m of the n input lines are asserted. After the output has been asserted, the output Z returns to NULL when all input lines A1 through An return to NULL.

Figure 4:
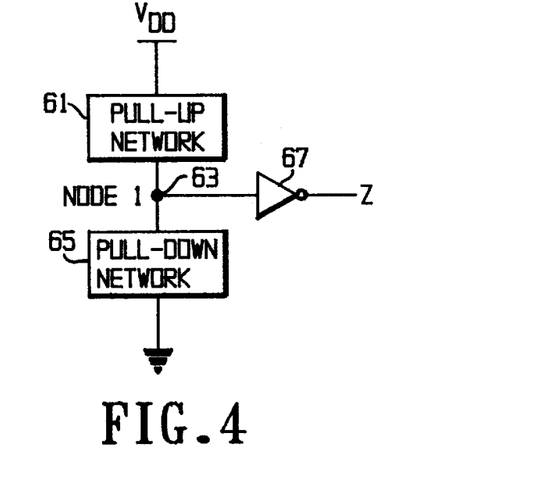
FIG. 4 illustrates a schematic diagram for a basic NULL convention threshold gate.

FIG. 4 is a block diagram of a basic NULL convention threshold gate. Generally speaking, threshold gates can be configured to operate in a static, semi-static, semi-dynamic, or dynamic fashion. They can also be configured to represent NULL as any state, e.g., as a high voltage or as a low voltage when two voltage states are used. The threshold gate shown in FIG. 4 will be discussed with reference to a dynamic threshold gate, although the present invention is equally applicable to the other types of threshold gates, as will be readily apparent to those in the art. Further gate variations are disclosed in U.S. Pat. No. 5,656,948 (incorporated herein by reference entirely). Further variations are described in copending application Ser. No. 09/004,335, "Semi-Dynamic and Dynamic Threshold Gates with Flash and Set Capability" by Gerald E. Sobelman and Jason J. Hinze filed on even date herewith (incorporated herein by reference entirely).

The dynamic NULL convention threshold gate includes: (1) a "go-to-NULL" (GTN) pull-up network 61 comprising PMOS transistors that, when ON, establish a connection between node 63 and VDD; (2) a "go-to-Data" (GTD) pull-down network 65 comprising NMOS transistors that, when ON, establish a connection between node 63 and ground; and (3) a static CMOS inverter 67 that drives the output Z.

As previously stated, the threshold gate depicted in FIG. 4 is a basic building block of NULL convention logic systems. NULL convention logic circuits can be designed to perform a host of tasks by interconnecting various types of threshold gates in various configurations. Generally speaking, in circuits made of interconnected NULL convention logic gates, alternating NULL and data wavefronts propagate from the inputs to the outputs. The data wavefronts form particular output results according to the desired operation, and the NULL wavefronts clear the logic gates for the next data wavefront.

Though NULL and Data wavefronts are similar in many respects, one important difference between them exists. The propagation through the circuit of a NULL wavefront always results in the same outcome, namely that all threshold gate outputs become NULL. With the propagation of Data wavefronts, however, some of the threshold gates within the circuit go to Data as the wavefront passes through the system, but others do not. The precise subset of threshold gate outputs that change depend upon the particular set of input operands applied to the circuit. Thus, desired output information is created by the Data wavefront, while the NULL wavefront can be considered to be a necessary but relatively invariant part of the computation process.

In order to maximize the speed and efficiency of the circuit, it is desireable to minimize the amount of time consumed by the NULL wavefront in propagating through the system so that the majority of the time is devoted to Data wavefront propagation. The present invention accomplishes this goal by simultaneously driving every gate within a given functional block to NULL in parallel, so that a NULL wavefront need not propagate through a system sequentially from the first gate to the last gate.

In NULL convention systems, circuits may be designed with a "completion detector" that generates a signal when all threshold gates in a given block of the circuit have completely responded to a given Data or NULL wavefront and are ready to receive the next wavefront. Completion detectors may be coupled to detect whether the last sequential level of logic in a system has responded in order to reduce the number of connections to the completion detector. This method takes advantage of a characteristic of NULL convention circuits, i.e., that earlier levels of logic will have completed their computations before the last level.

When all threshold gates are simultaneously driven to NULL in parallel, the detection of completion at only the last level of logic in a system is still an accurate measure, because the time discrepancies during which all of the hysteresis units within a circuit go to NULL (or go to Data) are small compared to: (1) the combined delays of the propagation delay through the completion detector itself, and (2) the inherent delay associated with the arrival of the next Data or NULL wavefront.

Figure 5:
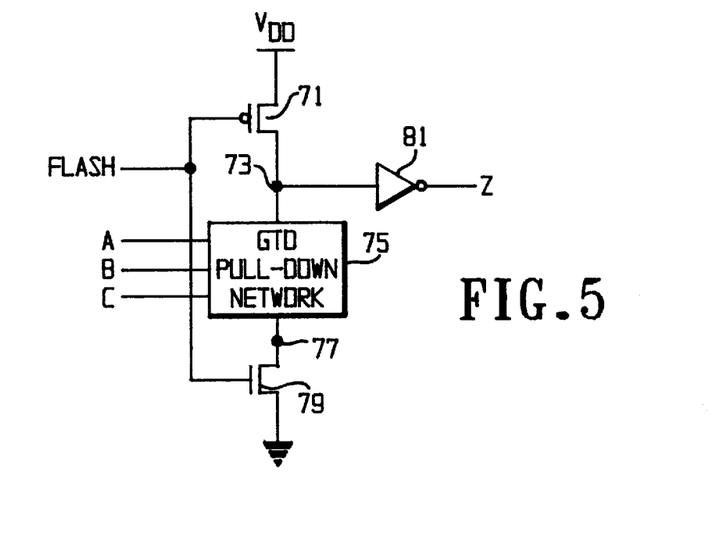
FIG. 5 illustrates a dynamic flash-type threshold gate.

FIG. 5 illustrates a dynamic flash-type threshold gate. The dynamic flash-type threshold gate comprises: (1) a PMOS transistor 71 that, when ON, establishes a connection between node 73 and VDD; (2) a "go-to-data" (GTD) pull-down network 75 comprising NMOS transistors that, when ON, establish a connection between node 73 and node 77; (3) an NMOS transistor 79 that, when ON, establishes a connection between node 77 and ground; and (4) a static CMOS inverter 81 that drives the output Z.

This and other FLASH-type Null convention logic gates described herein do not have pull-up networks, but rely on the FLASH signal to return to NULL. It will be appreciated that pull-up networks may additionally be included to accommodate applications which do not utilize the FLASH signal.

In operation, when the input FLASH signal goes to ground (low), the transistor 71 turns ON and transistor 79 turns OFF, so that the node 73 is pulled to VDD (high), and the output Z goes to ground. When the input FLASH signal goes to VDD, transistor 71 turns OFF, transistor 79 turns ON, and the output Z is determined by the GTD pull-down network 75. If the threshold condition has not been met, then the GTD pull-down network 75 is OFF, so that node 73 becomes isolated but remains high and output Z remains low. When enough input signals have gone high so that the threshold condition has been met, the GTD pull-down network 75 turns ON so that node 73 is pulled to ground and output Z goes high. Finally, when the input FLASH signal returns to ground, transistor 71 turns ON and transistor 79 turns OFF, so that node 73 is again pulled to VDD and the output Z goes to ground. It will also be appreciated that, when NULL is assigned to a positive voltage level, the circuit can be modified to drive node 73 to ground in response to the FLASH signal.

Figure 6:
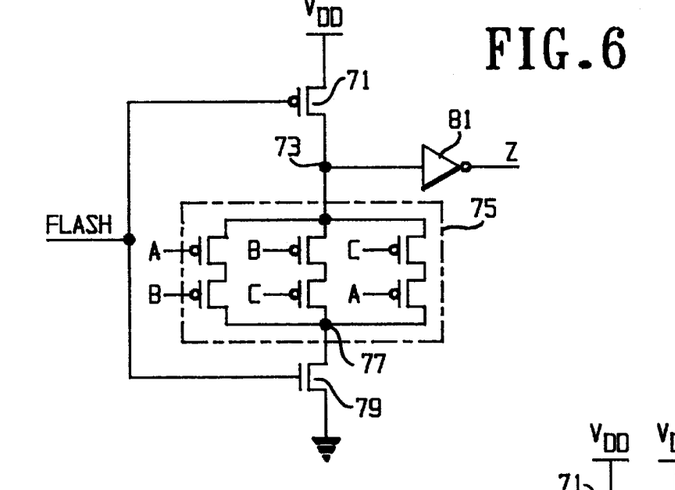
FIG. 6 illustrates a dynamic two-of-three flash-type threshold gate.

FIG. 6 illustrates a dynamic two-of-three flash-type threshold gate which operates according to the general principles described above. The GTD pull-down network 75 is a series-parallel network comprising six NMOS transistors arranged so as to create a connection between node 73 and node 77 when any two of three inputs A, B or C are asserted. The assignment of inputs A, B and C to the transistors within the GTD pull-down network 75 is designed to minimize undesireable charge sharing effects between the transistors. These charge sharing effects can be reduced further by laying out the circuit using minimum-sized shared diffusion regions between adjacent transistors within each series chain in the GTD pull-down network 75.

Figure 7:
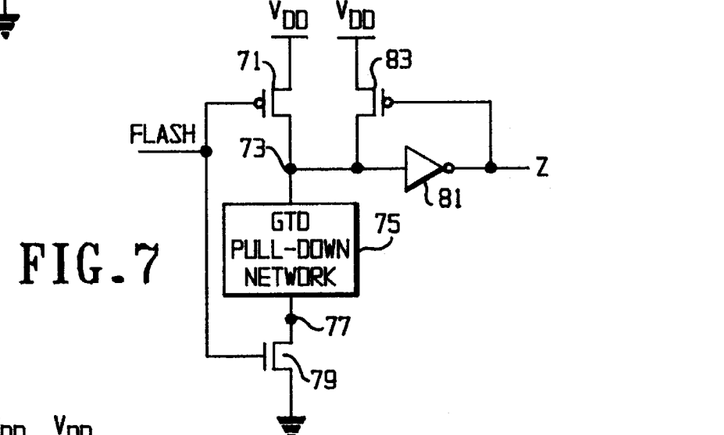
FIG. 7 illustrates a semi-dynamic flash-type threshold gate.

FIG. 7 illustrates a semi-dynamic flash-type threshold gate. As shown, the semi-dynamic flash-type gate consists of the same components as the dynamic flash-type gate of FIG. 5, with the addition of a weak feedback transistor 83. This transistor 83 maintains a VDD voltage level at node 73 in a situation where: (1) output Z previously went to low, and (2) the input FLASH has gone high, but (3) the GTD pull-down network 75 has not yet turned ON. The weak feedback transistor 83 thus acts to ensure that the circuit operates properly in response to an arbitrarily slow wavefront rate (as long as the power supply voltage is maintained). If and when the threshold condition is met, node 73 will be pulled below the switching point of the inverter 81, because the transistor 83 is weak compared to the transistors in the GTD pull-down network 75.

Figure 8:
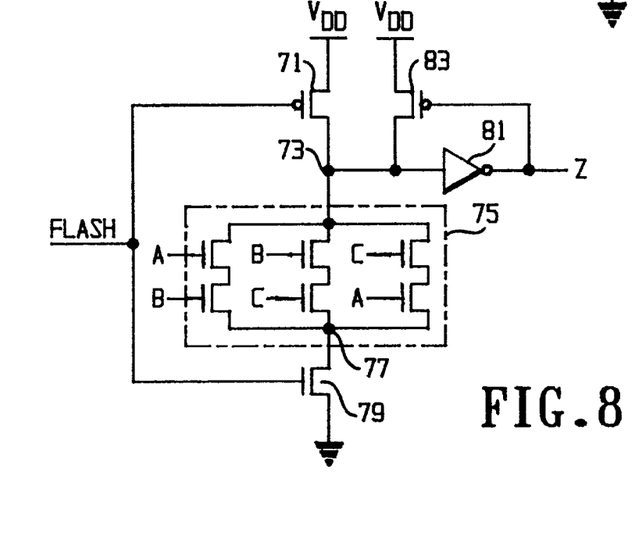
FIG. 8 illustrates a two-of-three semi-dynamic flash-type threshold gate.

FIG. 8 shows a two-of-three semi-dynamic flash-type threshold gate. The GTD pull-down network 75 comprises a series-parallel network of six NMOS transistors, arranged as in the pull-down network of FIG. 6. As is the case with FIG. 6, the assignment of inputs A, B and C to the transistors within the GTD pull-down network 75 is designed to minimize undesireable charge sharing effects between the transistors. These charge sharing effects can be reduced further by laying out the circuit using minimum-sized shared diffusion regions between adjacent transistors within each series chain in the GTD pull-down network 75.

Figure 9:
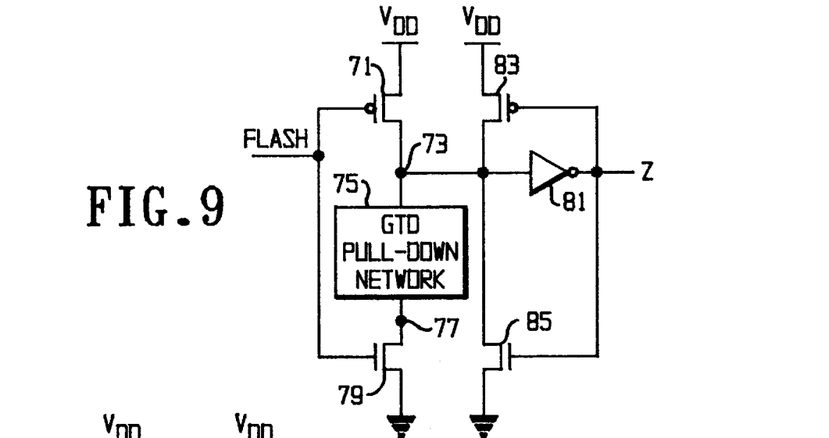
FIG. 9 illustrates a semi-static flash-type threshold gate.

FIG. 9 illustrates a semi-static flash-type threshold gate. As shown, the gate comprises the same functional elements as the semi-dynamic flash-type threshold gate illustrated in FIG. 7, but with an additional weak feedback transistor 85. The weak feedback transistor 85 operates to maintain a ground level at node 73 in the situation where: (1) output Z previously went high, (2) the GTD pull-down network 75 is OFF, and (3) input FLASH is high. Since transistor 85 is weak, it can be overridden by the transistor 71 so that the voltage at node 73 will rise above the switching point of the static CMOS inverter 81 when FLASH goes to zero or when the inputs all are NULL.

Figure 10:
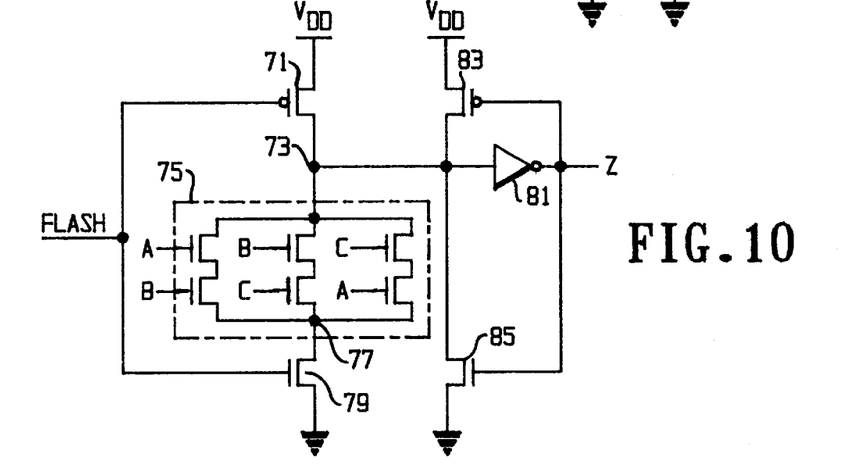
FIG. 10 illustrates a semi-static two-of-three flash-type threshold gate.

FIG. 10 illustrates a semi-static two-of-three flash-type threshold gate. The GTD network 75 is a series-parallel network comprising six NMOS transistors arranged as in the pull-down network 75 of FIG. 6. As is the case with FIGS. 6 and 8, the assignment of inputs A, B and C to the transistors within the GTD pull-down network 75 is designed to minimize undesireable charge sharing effects between the transistors. These charge sharing effects can be reduced further by laying out the circuit using minimum-sized shared diffusion regions between adjacent transistors within each series chain in the GTD pull-down network 75.

Figure 11:
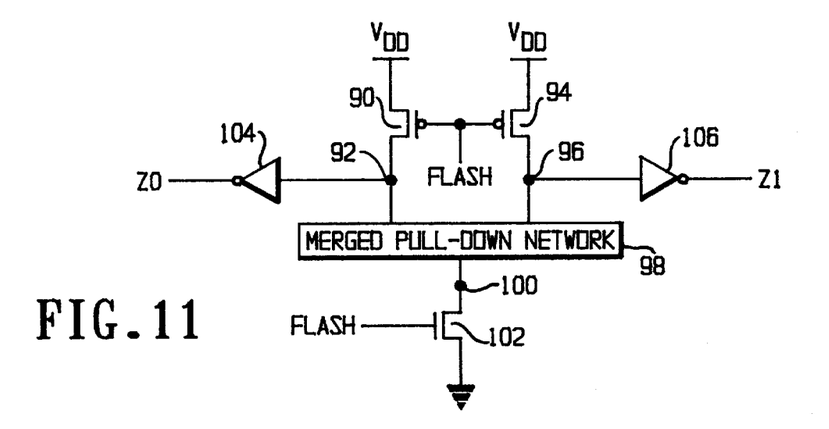
FIG. 11 illustrates a flash-type merged network.

FIG. 11 illustrates an alternative configuration for a flash NULL circuit, referred to here as a flash-type merged network. A single flash-type merged network can perform the functions of two or more flash-type threshold gates. Generally speaking, a flash-type merged network comprises a circuit block having a set of dual-rail input pairs (not shown) and a dual-rail output pair (Z.0, Z.1).

A flash-type merged network comprises: (1) a PMOS transistor 90 that, when ON, establishes a direct connection between node 92 and VDD; (2) a PMOS transistor 94 that, when ON, establishes a connection between node 96 and VDD; (3) a merged pull-down network 98 comprising NMOS transistors that, when ON, establish a connection between node 100 and either node 92 or node 96; (4) an NMOS transistor 102 that, when ON, establishes a connection between node 100 and ground; (5) a static CMOS inverter 104 that drives the output node Z.0; and (6) a static CMOS inverter 106 that drives the output Z.1.

In operation, when FLASH goes to ground, transistors 90 and 94 turn ON, nodes 92 and 96 are pulled to VDD and the output nodes Z.0 and Z.1 go to zero. Transistor 102 turns OFF, thereby isolating merged pull-down network 98 from ground. When FLASH goes high, transistors 90 and 94 turn OFF and transistor 102 turns ON. If the merged network condition has not been met, then the merged pull-down network 98 is OFF. Nodes 92 and 96 become isolated but remain high, and outputs Z.0 and Z.1 remain low. When enough input signals have gone high so that the merged network condition has been met, merged pull-down network 98 pulls either node 92 or node 96 to ground. The corresponding output node will go high, while the other output node will remain at zero. When FLASH returns to ground, transistors 90 and 94 turn ON, and transistor 102 turns OFF. Nodes 92 and 96 are pulled to VDD, and the output nodes Z.0 and Z.1 both become zero.

Figure 12:
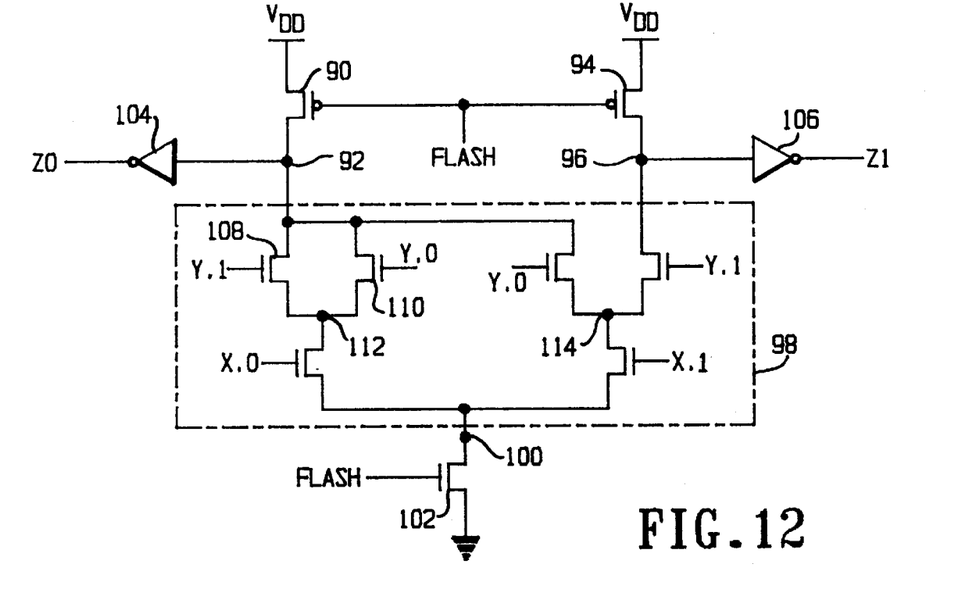
FIG. 12 illustrates a dynamic flash-type merged network configured to perform an AND function.

FIG. 12 illustrates an example of a dynamic flash-type merged network, namely, a dual-rail AND function circuit. The circuit includes two dual-rail input pairs, X.0, X.1, and Y.0, Y.1, and one dual-rail output pair, Z.0 and Z.1. The topology of the merged pull-down network 98 is similar to that used in the known Differential Cascode Voltage Switch (DCVS) technique, but with the addition of parallel transistors 108 and 110 which act to ensure that node 96 will not be pulled low until the Y operand has gone to data. This configuration ensures that the outputs will not go to data until both of the inputs have gone to data.

Undesireable charge sharing effects between nodes 92 and 96 and the intermediate nodes 112 and 114 may be minimized in either of two ways. The first method is to ensure that the capacitances at nodes 92 and 96 are much larger than the capacitances at nodes 112 and 114. The circuit of FIG. 12 is drawn assuming that the device sizes and the layout parasitics have been arranged in this manner.

Figure 13:
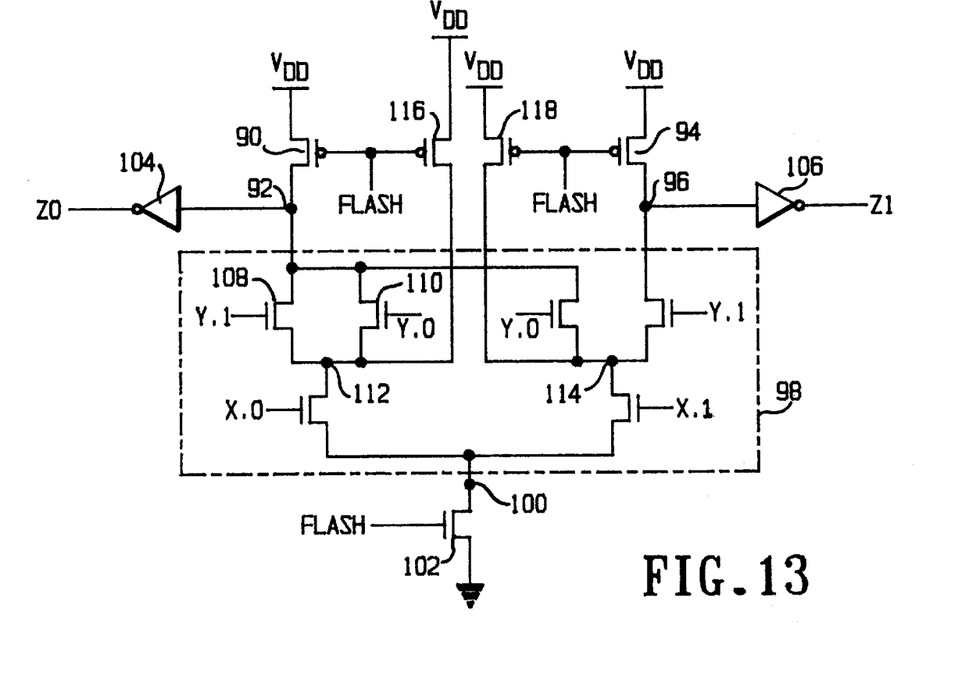
FIG. 13 illustrates an alternate flash-type merged network configured to perform an AND function.

The second method of reducing charge sharing in a dynamic flash-type merged network is illustrated in FIG. 13, by including additional PMOS transistors 116 and 118 so that the intermediate nodes 112 and 114 in the merged pull-down network are charged to VDD when FLASH is low.

Figure 14:
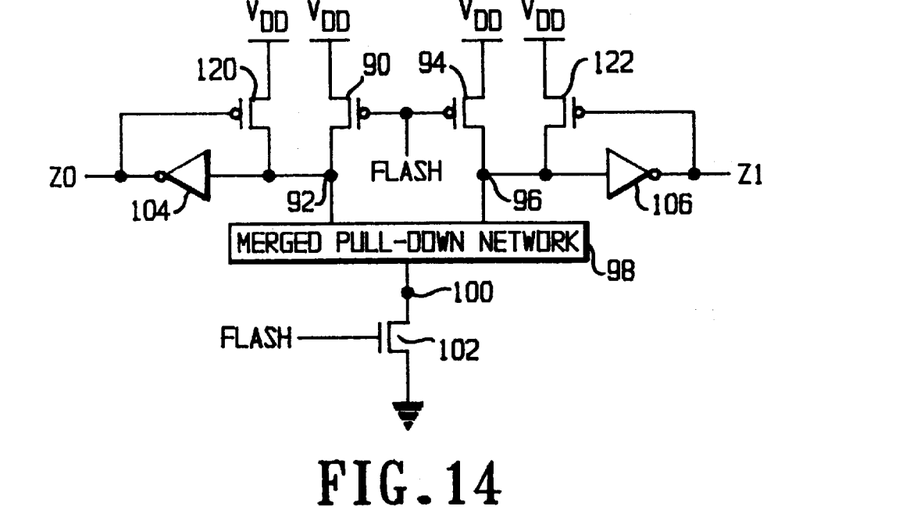
FIG. 14 illustrates a semi-dynamic flash-type merged network.

FIG. 14 depicts a semi-dynamic flash-type merged network. The semi-dynamic flash-type merged network includes many of the same elements that are contained in the dynamic flash-type threshold gate, plus the additional weak feedback transistors 120 and 122. The purpose of the weak transistor 120 is to maintain a previously-established VDD voltage level at node 92 in the situation when: (1) FLASH has gone high, but (2) the merged pull-down network 98 has not pulled node 92 to ground. The weak transistor 122 performs an analogous function with respect to node 96. The operation of these two transistors is similar to the operation of weak transistor 83 described above with reference to FIG. 7. These two transistors 120 and 122 ensure that the circuit will operate properly at an arbitrarily slow wavefront rate (as long as the power supply voltage is maintained). When the merged pull-down network turns ON, either node 92 or node 96 will be pulled below the switching point of the corresponding inverter 104 or 106, because the transistors 120 and 122 are weak compared to the transistors in the merged pull-down network 98.

Figure 15:
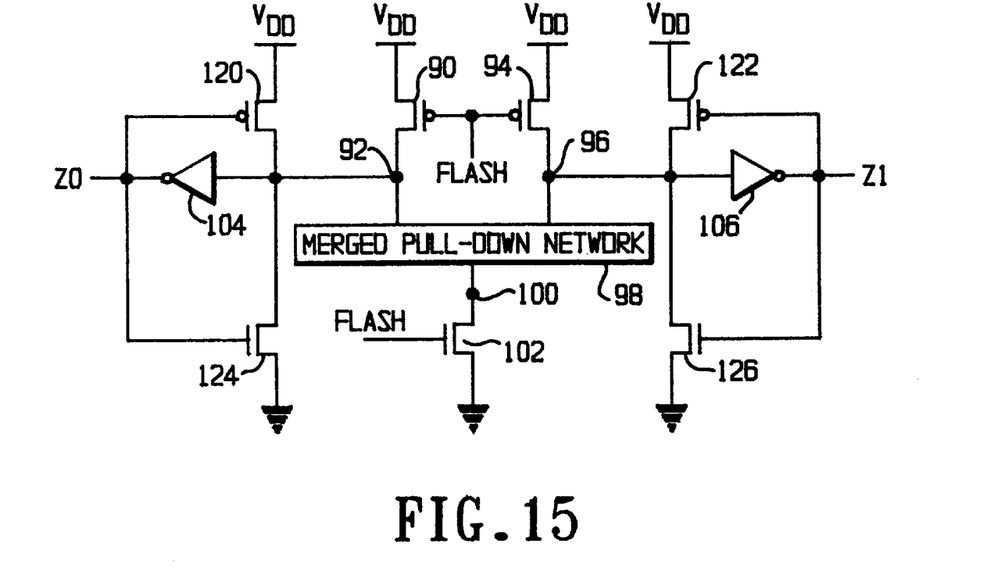
FIG. 15 illustrates a semi-static flash-type merged network.

FIG. 15 shows a semi-static flash-type merged network. As shown, the circuit includes many of the same elements that are contained in the semi-dynamic flash-type merged network of FIG. 14, plus the additional weak feedback transistors 124 and 126. The purpose of the weak transistor 124 is to maintain a previously-established ground level at node 92 in the situation where the left side of the merged network 98 is OFF and FLASH is high. The weak transistor 126 performs an analogous function with respect to node 96. The operation of these weak transistors 124, 126 is similar to the operation of weak pull-down transistor 85 discussed above with reference to FIG. 9. These two transistors thus provide additional robustness to the circuit. When FLASH becomes low, nodes 92 and 96 will be pulled above the switching point of the corresponding static CMOS inverters 104 or 106, because the transistors 124 and 126 are weak compared to the transistors 90 and 94.

Figure 16:
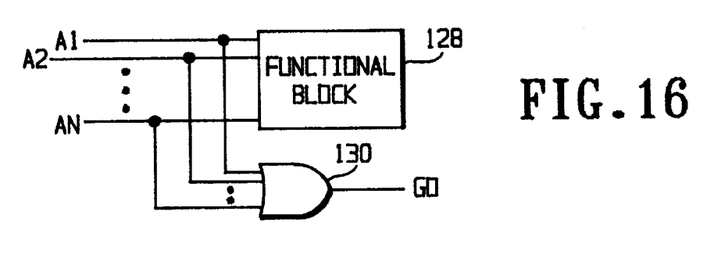
FIG. 16 illustrates a block diagram for a functional block which utilizes flash NULL.

FIG. 16 shows a functional block using flash Null. The inputs A1, A2, . . . , AN are applied to the inputs of the NULL Convention gates in the first level of logic of the functional block 128. (For example, inputs A1 and A2 may be two lines of a dual rail pair.) The inputs are also applied to a separate N-input OR gate 130 to create a "GO" signal, as shown in the figure. The GO signal may be applied directly to the FLASH inputs of all gates within the functional block 128. Alternatively, the GO signal may be buffered to more efficiently drive the large load capacitance at that node.

Figure 17:
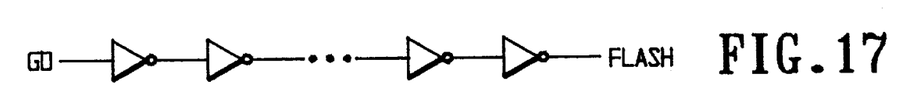
FIG. 17 illustrates a buffering network for a flash NULL circuit.
Figure 18:
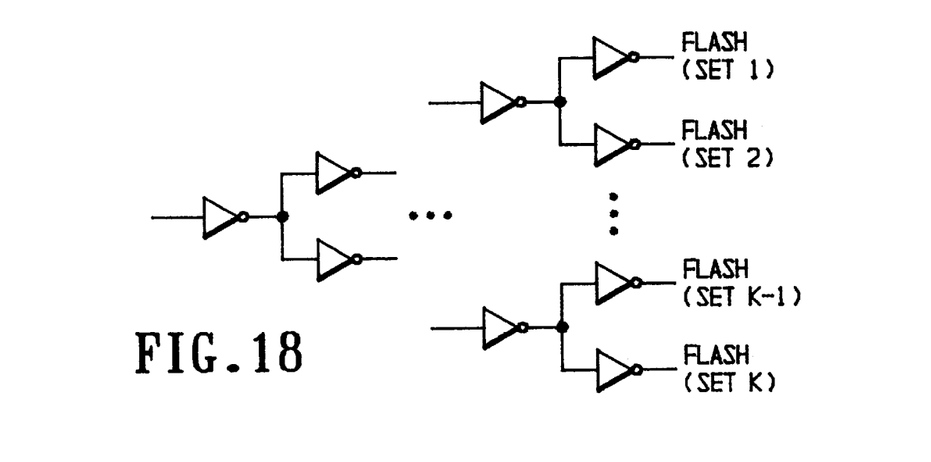
FIG. 18 illustrates an alternative buffering network for a flash NULL circuit.

Examples of suitable buffering networks are shown in FIGS. 17 and 18. FIG. 17 shows a series string of an even number of inverters where the physical widths of the devices increase from the first one to the last one.

FIG. 18 shows a tree-type arrangement of inverters with an even number of levels where the widths of the devices increase in each successive level of the tree. The individual FLASH inputs of all of the hysteresis units within the functional block are partitioned into K sets, and each inverter at the final level of the tree drives the FLASH inputs belonging to one of the sets. The network of FIG. 18 has a branching factor of 2, but other similar networks can be constructed with higher branching factors or with non-uniform branching factors.

It is important to note that these two types of buffering networks are not analogous to global clock distribution networks because they result from asynchronous inputs A1

... An, and further because they only drive the FLASH inputs within a given functional block. Each functional block using flash Null would have its own separate network.

With reference again to FIG. 16, the functional block operates as follows. When all inputs A1, A2, . . . , AN are Null (e.g., at low voltage), the GO signal becomes low. This, in turn, will drive the FLASH inputs of all gates to ground, so that the outputs of all gates within the functional block 128 go to NULL. As soon as any one of the inputs to the functional block goes high, the GO signal becomes high. This will enable each individual gate to assert meaningful data values if and when a data wavefront arrives at its inputs. The GO signal will remain high throughout the interval during which the data wavefront is present at the inputs to the functional block. It will continue to remain high until the next complete NULL wavefront arrives at the inputs to the functional block, at which point it will return low and the above cycle will begin again.

In many applications, it is important to be able to establish the initial state of a system. In some cases, initialization may be accomplished by applying a series of NULL and Data wavefronts at the normal inputs to a system. In other cases, it is more appropriate to establish the initial state directly by activating an independent reset input signal. The present invention describes NULL convention threshold gate circuit implementations that allow this direct type of initialization to be accomplished.

Case 1—Reset to Ground

Figure 19:
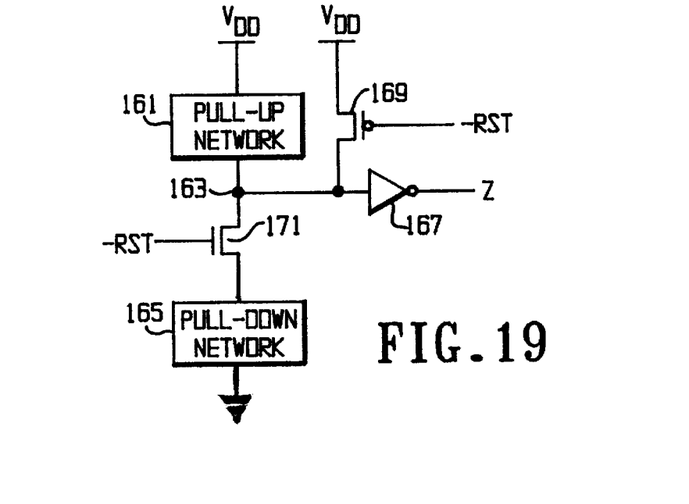
FIG. 19 illustrates a threshold gate with reset-to-zero capability.

FIG. 19 illustrates a threshold gate configured with reset to zero capability. As shown, the circuit includes a Pull-Up Network 161, a Pull-Down Network 165 and an inverting output driver 167. The gate also includes transistors 169 and 171 which implement the reset to ground function. Examples of pull-up and pull-down networks can be found in U.S. Pat. No. 5,656,948. Although FIG. 19 particularly illustrates a dynamic threshold gate, it should be understood from this example that semi-dynamic, semi-static and static threshold gates, with and without feedback connection from output Z, may be similarly configured as desired with only minor modifications that will be apparent to those in the art and which will fall within the scope of the present invention. It will also be appreciated that modifications can be made for systems where NULL is a high voltage level, rather than ground.

The input signal –RST is the active-low reset signal that controls whether or not the circuit is in its reset mode. The circuit operates in the following manner.

If –RST=ground (low voltage), then the threshold gate output is reset to NULL. The low input at –RST results in transistor 169 being ON and transistor 171 being OFF, so that node 163 is pulled up to VDD regardless of the values of the external input signal lines to the threshold gate. Thus, the output Z is forced to ground, which is the desired reset value.

If –RST=high (high voltage), then the threshold gate is not reset, and the gate is allowed to proceed with its logical functions. Transistor 169 is OFF and transistor 171 is ON, so that the behavior of the circuit is determined by the action of the pull-up and pull-down networks in response to the input signal lines to the threshold gate.

Figure 20:
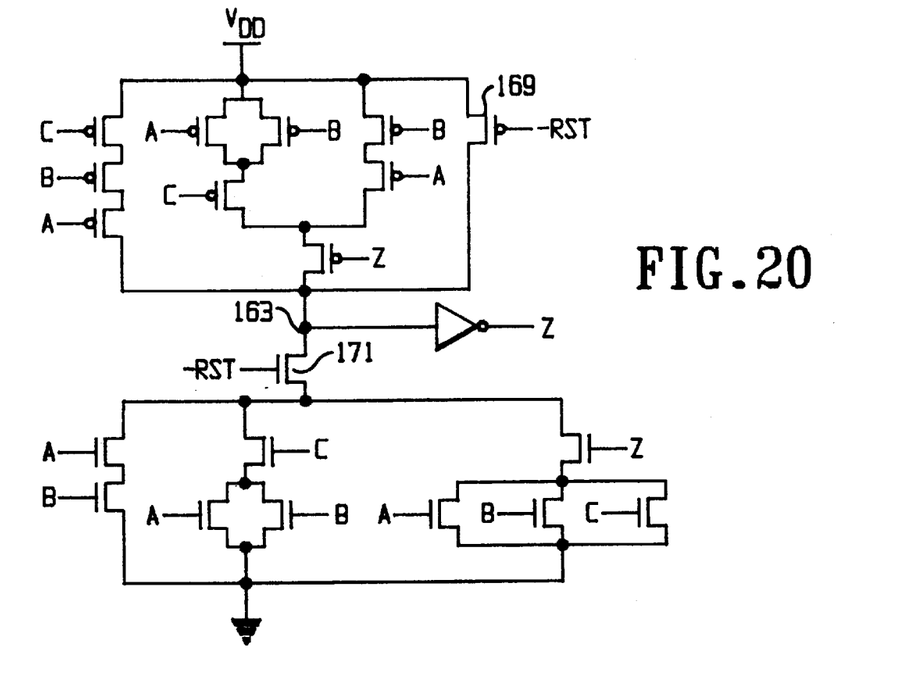
FIG. 20 illustrates a static two-of-three threshold gate with reset-to-zero capability.

FIG. 20 illustrates an example of a threshold gate equipped with reset to ground capability. FIG. 20 particularly depicts a static 2-of-3 threshold gate with reset to ground, although as previously stated, static, other types of gates, such as semi-static, semi-dynamic or dynamic thresh- old gates, or gates having any combination of input signal lines and threshold values, may be similarly configured with reset to ground capability.

Case 2—Reset to VDD

Figure 21:
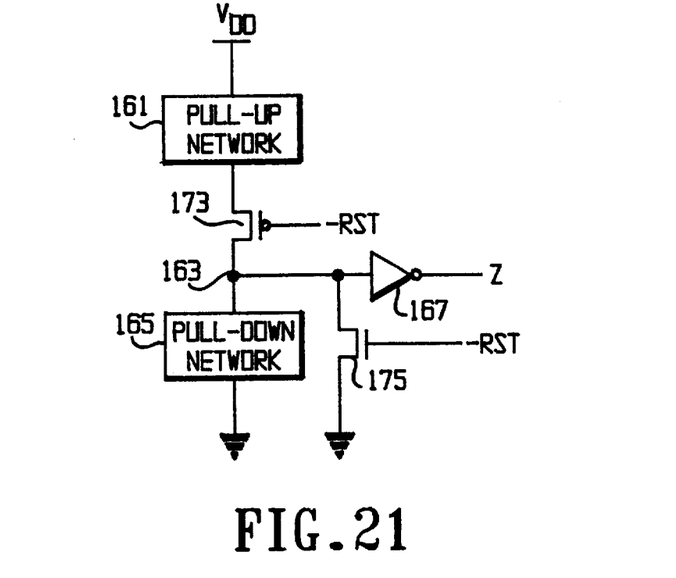
FIG. 21 illustrates a threshold gate with reset-to-one capability.

FIG. 21 illustrates a threshold gate equipped with reset to VDD capability. As shown, the threshold gate includes the basic elements described with reference to FIG. 4, plus the transistors 173 and 175 which implement the reset to VDD function. As is the case with the reset to ground function, although FIG. 21 particularly illustrates a dynamic threshold gate with reset to VDD capability, it should be understood that static, semi-static or semi-dynamic circuits, with and without feedback connections from the output Z, may also be similarly equipped with reset to VDD capability without departing from the scope of the present invention.

The input signal RST is the active-high reset signal that controls whether or not the circuit is in its reset mode. The circuit operates as follows.

If RST=VDD (high), then the threshold gate output resets to VDD. Transistor 173 is OFF and transistor 175 is ON, so that node 163 is pulled down to ground regardless of the values applied to the input signal lines of the threshold gate. Thus, the output Z is forced to VDD, which is the desired reset value.

If RST=ground, then the reset function is not activated. Transistor 173 is ON and transistor 175 is OFF, so that the behavior of the circuit is determined by the action of the pull-up and pull-down networks in response to the values applied at the input signal lines to the threshold gate.

Figure 22:
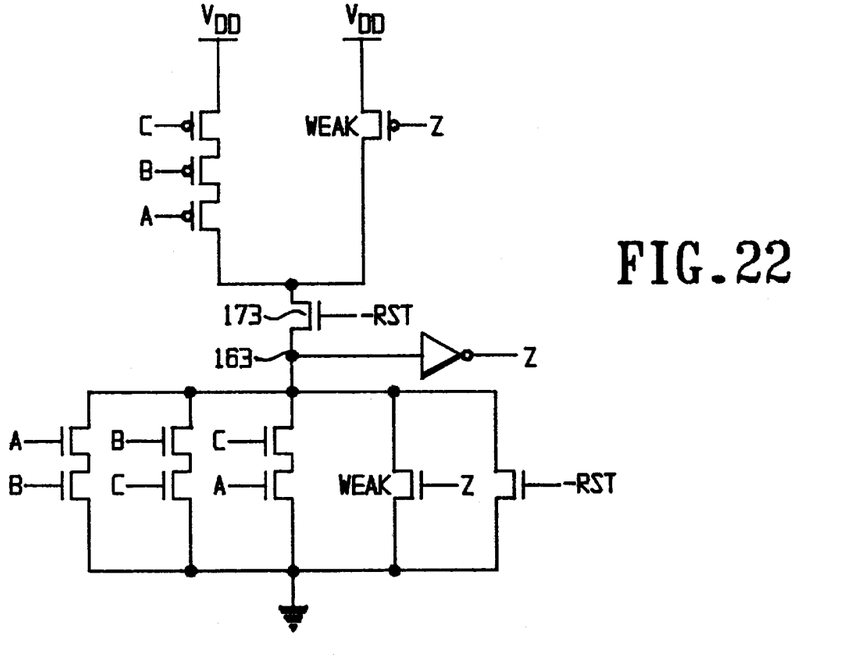
FIG. 22 illustrates a semi-static two-of-three threshold gate with reset-to-one capability.

FIG. 22 illustrates an example of a threshold gate equipped with reset to VDD capability. FIG. 22 depicts a semi-static 2-of-3 threshold gate with reset to VDD, although other types of threshold gates, such as static, semi-dynamic or dynamic threshold gates, or gates having any combination of input signal lines and threshold values, may also be equipped with the reset to VDD capability.

Case 3—Reset to Either Ground or VDD

Figure 23:
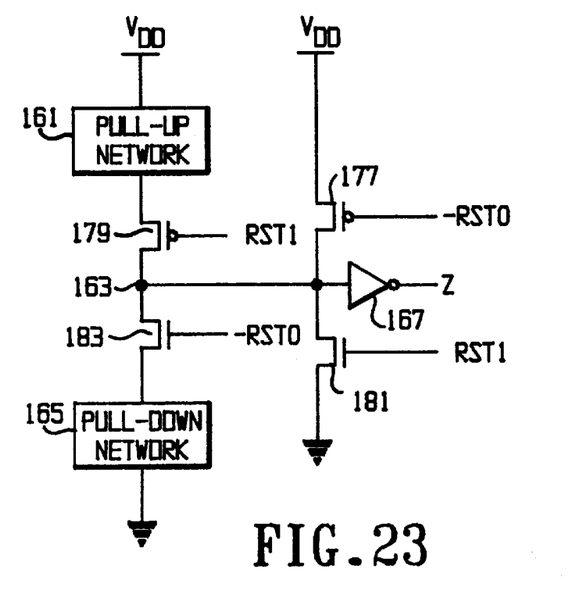
FIG. 23 illustrates a NULL convention threshold gate with reset-to-either-zero-or-one capability.

FIG. 23 illustrates a threshold gate equipped with a reset to ground or VDD capability. As shown, the circuit gate includes the basic elements of a threshold gate, plus additional transistors 177, 179, 181 and 183 which implement the reset function. Although FIG. 23 particularly depicts a dynamic gate, it should be understood that semi-dynamic, semi-static or static threshold gates may be similarly configured with this reset capability. The input signal –RST0 is an active-low reset signal and the input signal RST1 is an active-high reset signal that together control whether or not the circuit is in its reset mode. The circuit operation is as follows.

If –RST0=ground and RST1=ground, then the threshold gate output resets to VDD. Transistor 177 is ON, transistor 179 is ON, transistor 181 is OFF and transistor 183 is OFF, so that node 163 is pulled up to VDD regardless of the values applied at the input signal lines to the threshold gate. Output Z is thus forced to ground, which is the desired reset value.

If –RST0=VDD and RST1 VDD, then the threshold gate resets to VDD. Transistor 177 is OFF, transistor 179 is OFF, transistor 181 is ON and transistor 183 is ON, so that node 163 is pulled down to ground regardless of the values at the threshold gate input signal lines. Thus, the output Z is forced to VDD, which is the desired reset value.

If –RST0=VDD and RST1=ground, then the threshold gate is not reset and is allowed to perform its logical function based upon the input signal values. Transistor 177 is OFF, transistor 179 is ON, transistor 181 is OFF and transistor 183 is ON, so that the behavior of the circuit is determined by the action of the pull-up and pull-down networks in response to the values at the threshold gate input signal lines.

In the present invention, the combination −RST0=ground and RST1=VDD is not allowed.

Figure 24:
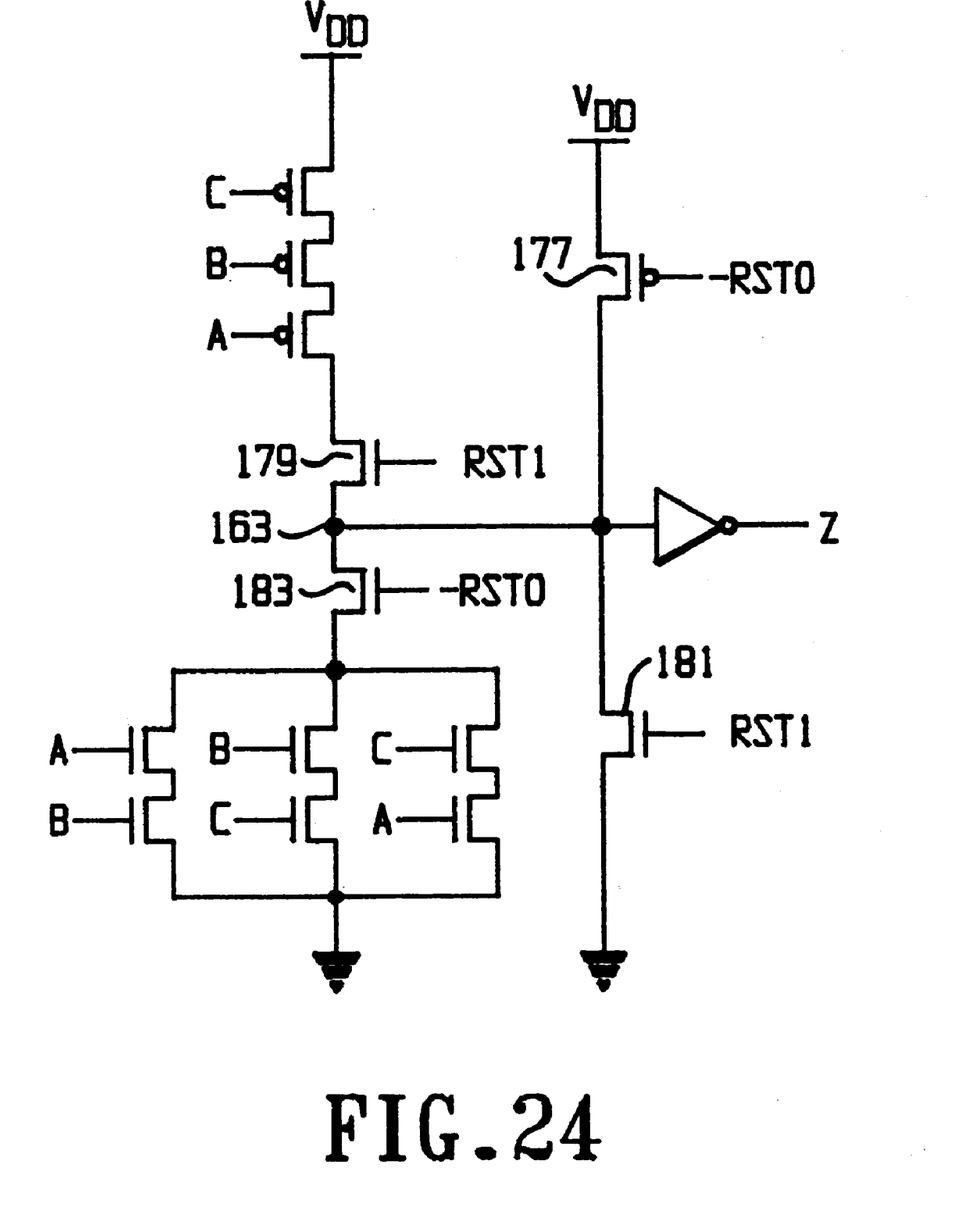
FIG. 24 illustrates a dynamic two-of-three threshold gate with reset-to-either-zero-or-one capability.

FIG. 24 shows an example of a threshold gate configured with reset to ground or VDD capability. FIG. 24 depicts a dynamic 2-of-3 threshold gate with reset to ground or VDD, although it should be understood that other types of threshold gates may also be configured in a similar manner to obtain the reset to ground or VDD capability.

In the circuits described above, NULL was assigned to the ground voltage level and ASSERTED was assigned to the VDD voltage level. It will be appreciated that similar circuits can be designed where NULL is assigned the VDD voltage level, and ASSERTED is assigned the ground voltage level. This can be accomplished, for example, by replacing N-MOS devices with P-MOS devices (and vice versa), and reversing the VDD and ground connections.

Although the present invention has been described with reference to the particular preferred embodiments discussed herein, various modifications will be apparent to those in the art which fall within the spirit and scope of the present invention. The embodiments described herein are exemplary and not intended to limit the scope of the invention as set forth in the appended claims.

What is claimed is:

1. An m-of-n flash-type threshold gate comprising:

a plurality of n input signal lines, each having an asserted state and a NULL state;

a FLASH input signal line having a first state and a second state;

an output signal line having an asserted state and a NULL state; and a hysteresis circuit switching the output signal line from the NULL state to the asserted state when (i) each and every combination of a number m of input signal lines change from the NULL state to the asserted state, m being less than, and (ii) the FLASH input is in the first state; said hysteresis circuit further holding the output signal line in an asserted state until the FLASH input line changes from the first state to the second state.

2. The gate of claim 1 wherein the hysteresis circuit comprises:

a driver generating an asserted output on the output signal line when a signal node is in a first state, and generating a NULL output on the output signal when the signal node is in a second state;

a first circuit pulling the signal node to the first state when a combination of m input signal lines are asserted and holding the signal node in the first state while both the driver output and at least one input signal are asserted;

a second transistor circuit pulling the signal node to the second state when the FLASH input signal line is in the second state.

3. The m-of-n threshold gate of claim 1, wherein said input lines are organized into at least one mutually exclusive assertion group, said mutually exclusive assertion group characterized by having at most one input signal line at a time within said mutually exclusive assertion group in the asserted state.

4. The m-of-n threshold gate of claim 1, having at least two output signal lines having an asserted state and a NULL state, said output signal lines organized into at least one mutually exclusive assertion group, said mutually exclusive assertion group characterized by having at most one output signal line at a time within said mutually exclusive assertion group in the asserted state.

5. The m-of-n threshold gate of claim 3, wherein at least one mutually exclusive assertion group comprises two input signal lines.

6. The m-of-n threshold gate of claim 3, wherein at least one mutually exclusive assertion group comprises more than two input signal lines.

7. The m-of-n threshold gate of claim 4, wherein at least one mutually exclusive assertion group comprises two output signal lines.

8. The m-of-n threshold gate of claim 4, wherein at least one mutually exclusive assertion group comprises more than two output signal lines.

9. A flash-type circuit comprising:

a plurality of input signal lines, each line having an asserted state and a NULL state;

a plurality of flash-type threshold gates coupled to said input lines and to each other, each NULL convention threshold gate adapted to generate either a NULL or an asserted output in response each and every combination of its respective input signal lines; and a FLASH input signal line coupled to at least one of the flash-type threshold gates and having a first state and a second state;

wherein the flash-type NULL convention threshold gates that are coupled to the FLASH input signal line are adapted to simultaneously generate a NULL output in response to the FLASH input signal changing from its first state to its second state.

10. The flash-type NULL convention circuit of claim 9, wherein said input lines are organized into at least one mutually exclusive assertion group, said mutually exclusive assertion group characterized by having at most one input signal line at a time within said mutually exclusive assertion group in the asserted state.

11. The flash-type NULL convention circuit of claim 9, having at least two output signal lines having an asserted state and a NULL state, said output signal lines organized into at least one mutually exclusive assertion group, said mutually exclusive assertion group characterized by having at most one output signal line at a time within said mutually exclusive assertion group in the asserted state.

12. The flash-type NULL convention circuit of claim 10, wherein at least one mutually exclusive assertion group comprises two input signal lines.

13. The flash-type NULL convention circuit of claim 10, wherein at least one mutually exclusive assertion group comprises more than two input signal lines.

14. The flash-type NULL convention circuit of claim 11, wherein at least one mutually exclusive assertion group comprises two output signal lines.

15. The flash-type NULL convention circuit of claim 11, wherein at least one mutually exclusive assertion group comprises more than two output signal lines.

16. A flash-type merged network, comprising:

a plurality of input signal lines, each having an asserted state and a NULL state;

a FLASH input signal line having a first state and a second state;

first and second output signal lines, each having an asserted state and a NULL state; and a hysteresis circuit selectively switching one of the first and second output signal lines from the NULL state to the asserted state in response to particular combinations of the input signal lines changing from the NULL state to the asserted state, holding the asserted signal line in the asserted state until the FLASH input line changes from the first state to the second state, and selectively switching the first and second output signal lines from the asserted state to the NULL state when the FLASH input line changes from the first state to the second state.

17. The flash-type merged network of claim 16 wherein the hysteresis circuit comprises:
   a driver generating an asserted output on the output signal line when a signal node is in a first state, and generating a NULL output on the output signal line when the signal node is in a second state;
   a first transistor circuit pulling the signal node to the first state when a combination of input signal lines is asserted and holding the signal node in the first state while both the driver output and at least one input signal are asserted;
   a second transistor circuit pulling the signal node to the second state when the FLASH input signal line is in the second state.

18. The flash-type NULL convention merged network of claim 16, wherein said input lines are organized into at least one mutually exclusive assertion group, said mutually exclusive assertion group characterized by having at most one input signal line at a time within said mutually exclusive assertion group in the asserted state.

19. The flash-type NULL convention merged network of claim 16, wherein said output lines are organized into at least one mutually exclusive assertion group, said mutually exclusive assertion group characterized by having at most one output signal line at a time within said mutually exclusive assertion group in the asserted state.

20. The flash-type merged network of claim 16, further comprising a monitor gate having an output connected to said FLASH input signal line, said input signal lines connected to said monitor circuit to switch said FLASH input signal line from said first state to said second state when at least one of said input signal lines is in the asserted state.

21. The flash-type merged network of claim 16, further comprising a monitor gate having an output line, said input signal lines connected to said monitor circuit to produce a GO signal when at least one of said input signal lines is in the asserted state.

22. The flash-type NULL convention merged network of claim 18, wherein at least one mutually exclusive assertion group comprises two input signal lines.

23. The flash-type NULL convention merged network of claim 18, wherein at least one mutually exclusive assertion group comprises more than two input signal lines.

24. The flash-type NULL convention merged network of claim 19, wherein at least one mutually exclusive assertion group comprises two output signal lines.

25. The flash-type NULL convention merged network of claim 19, wherein at least one mutually exclusive assertion group comprises more than two output signal lines.

26. The flash-type merged network of claim 21, wherein said output line is connected to said FLASH input signal line, said FLASH input signal line switching from said first state to said second state in response to said GO signal.

27. A m-of-n threshold gate with reset comprising:
   a plurality of n input signal lines, each having an asserted state and a NULL state;
   at least a first RESET input signal line having at least a first and a second state;
   an output signal line having an asserted state and a NULL state;
   a hysteresis circuit which,
      (i) when the RESET input signal line is in the first state, switches the output signal line from the NULL state to the asserted state when a number m of input signal lines change from the NULL state to the asserted state, m being less than n, and holding the output signal line in an asserted state until all input signal lines return to NULL, and
      (ii) when the RESET input signal line is in the second state, switches the output signal line to a predetermined one of either the NULL or asserted states regardless of the number of input signal lines that are asserted.

28. The gate of claim 27, comprising a second RESET input signal line, said first and second RESET signal lines collectively having at least three state combinations.

29. The m-of-n NULL convention threshold gate with reset of claim 27, wherein said input lines are organized into at least one mutually exclusive assertion group, said mutually exclusive assertion group characterized by having at most one input signal line at a time within said mutually exclusive assertion group in the asserted state.

30. The m-of-n NULL convention threshold gate with reset of claim 27, having at least two output signal lines having an asserted state and a NULL state, said output signal lines organized into at least one mutually exclusive assertion group, said mutually exclusive assertion group characterized by having at most one output signal line at a time within said mutually exclusive assertion group in the asserted state.

31. The gate of claim 28, wherein:
   when the RESET input signal lines are in a first state combination, the hysteresis circuit switches the output signal line from the NULL state to the asserted state when a number m of input signal lines change from the NULL state to the asserted state, m being less than or equal to n, and holding the output signal line in an asserted state until all input signal lines return to NULL;
   when the RESET input signal lines are in a second state combination, the hysteresis circuit switches the output signal line to the NULL state regardless of the number of input signal lines that are asserted; and
   when the RESET input signal lines are in a third state combination, the hysteresis circuit switches the output signal line to the asserted state regardless of the number of input signal lines that are asserted.

32. The m-of-n NULL convention threshold gate with reset of claim 29, wherein at least one mutually exclusive assertion group comprises two input signal lines.

33. The m-of-n NULL convention threshold gate with reset of claim 29, wherein at least one mutually exclusive assertion group comprises more than two input signal lines.

34. The m-of-n NULL convention threshold gate with reset of claim 30, wherein at least one mutually exclusive assertion group comprises two output signal lines.

35. The m-of-n NULL convention threshold gate with reset of claim 30, wherein at least one mutually exclusive assertion group comprises more than two output signal lines.

36. A circuit comprising:
   a plurality of input signal lines, each line having an asserted state and a NULL state;
   plurality of threshold gates coupled to said input signal lines and to each other, each threshold gate adapted to generate either a NULL output, a first asserted output, or a second asserted output in response to its respective input signal lines;

a reset input signal line coupled to at least one of the threshold gates and having a first state and a second state;

wherein the threshold gates that are coupled to the reset input signal line are adapted to simultaneously generate either the NULL output, the first asserted output, or the second asserted output in response to the reset input signal line changing from its first state to its second state.

37. The NULL convention circuit of claim 36, wherein said input lines are organized into at least one mutually exclusive assertion group, said mutually exclusive assertion group characterized by having at most one input signal line at a time within said mutually exclusive assertion group in the asserted state.

38. The NULL convention circuit of claim 36, having at least two output signal lines having an asserted state and a NULL state, said output signal lines organized into at least one mutually exclusive assertion group, said mutually exclusive assertion group characterized by having at most one output signal line at a time within said mutually exclusive assertion group in the asserted state.

39. The NULL convention circuit of claim 37, wherein at least one mutually exclusive assertion group comprises two input signal lines.

40. The NULL convention circuit of claim 37, wherein at least one mutually exclusive assertion group comprises more than two input signal lines.

41. The NULL convention circuit of claim 38, wherein at least one mutually exclusive assertion group comprises two output signal lines.

42. The NULL convention circuit of claim 38, wherein at least one mutually exclusive assertion group comprises more than two output signal lines.

* * * * *